United States Patent
Horikawa et al.

(10) Patent No.: US 10,944,035 B2
(45) Date of Patent: Mar. 9, 2021

(54) RESIN PACKAGE AND LIGHT-EMITTING DEVICE

(71) Applicant: NICHIA CORPORATION, Anan (JP)

(72) Inventors: Yuta Horikawa, Anan (JP); Takuya Miki, Tokushima (JP); Shoichi Ishikawa, Tokushima (JP); Ryosuke Wakaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/773,434

(22) Filed: Jan. 27, 2020

(65) Prior Publication Data

US 2020/0161523 A1 May 21, 2020

Related U.S. Application Data (63) Continuation of application No. 16/198,154, filed on Nov. 21, 2018, now Pat. No. 10,586,905.

(30) Foreign Application Priority Data

Nov. 29, 2017 (JP) ................ 2017-228484

(51) Int. Cl.
| | | |
|---|---|---|
| *H01L 33/62* | (2010.01) | |
| *H01L 33/48* | (2010.01) | |
| *H01L 25/07* | (2006.01) | |
| *H01L 25/075* | (2006.01) | |
| *H01L 23/495* | (2006.01) | |
| *H01L 23/498* | (2006.01) | |

(52) U.S. Cl.
CPC .......... *H01L 33/62* (2013.01); *H01L 25/0753* (2013.01); *H01L 33/486* (2013.01); *H01L 23/49541* (2013.01); *H01L 23/49548* (2013.01); *H01L 23/49838* (2013.01)

(58) Field of Classification Search
CPC .... H01L 33/62; H01L 33/486; H01L 25/0753
See application file for complete search history.

(56) References Cited

U.S. PATENT DOCUMENTS

| | | | |
|---|---|---|---|
| 6,630,729 B2 | 10/2003 | Huang | |
| 6,661,083 B2 | 12/2003 | Lee et al. | |
| 6,849,930 B2 | 2/2005 | Nakajima et al. | |

(Continued)

FOREIGN PATENT DOCUMENTS

| | | |
|---|---|---|
| JP | 2011-023484 A | 2/2011 |
| JP | 2013-125776 A | 6/2013 |

(Continued)

OTHER PUBLICATIONS

Notice of Allowance on U.S. Appl. No. 16/198,154 dated Oct. 31, 2019.

*Primary Examiner* — Ida M Soward
(74) *Attorney, Agent, or Firm* — Foley & Lardner LLP (57) ABSTRACT

A light-emitting device includes: a resin package including: a resin portion, a first lead having an upper surface and an end surface, a second lead having an upper surface and disposed opposite the first lead, and a recess having lateral surfaces and a bottom surface that includes a portion of the upper surface of the first lead and a portion of the upper surface of the second lead that are exposed from the resin portion; and a first light-emitting element and a second light-emitting element that are disposed in the recess.

20 Claims, 5 Drawing Sheets

(56) References Cited

U.S. PATENT DOCUMENTS

| | | |
|---|---|---|
| 6,909,168 B2 | 6/2005 | Minamio et al. |
| 7,554,182 B2 | 6/2009 | Shirasaka et al. |
| 7,804,159 B2 | 9/2010 | Shimanuki |
| 8,178,955 B2 | 5/2012 | Itou et al. |
| 8,193,091 B2 | 6/2012 | Kawai et al. |
| 8,502,359 B2 | 8/2013 | Koga et al. |
| 8,581,396 B2 | 11/2013 | Hasebe et al. |
| 9,093,621 B2 * | 7/2015 | Kasae .................. F21V 21/00 |
| 9,136,452 B2 * | 9/2015 | Oh ........................ H01L 33/62 |
| 10,153,411 B2 | 12/2018 | Naka et al. |
| 2012/0112622 A1 | 5/2012 | Suzuki et al. |
| 2013/0343067 A1 | 12/2013 | Okada |
| 2014/0252574 A1 | 9/2014 | Nakabayashi et al. |
| 2017/0155025 A1 | 6/2017 | Musashi |

FOREIGN PATENT DOCUMENTS

| | | |
|---|---|---|
| JP | 2017-103311 A | 6/2017 |
| WO | WO-2012/117974 A1 | 9/2012 |
| WO | WO-2014/136824 A1 | 9/2014 |

\* cited by examiner

RESIN PACKAGE AND LIGHT-EMITTING DEVICE

CROSS-REFERENCE TO RELATED APPLICATIONS

The present application is a continuation of U.S. patent application Ser. No. 16/198,154, filed on Nov. 21, 2018, which claims priority to Japanese Patent Application No. 2017-228484, filed on Nov. 29, 2017, the contents of which are hereby incorporated by reference in their entireties.

BACKGROUND

1. Field of the Invention

The disclosure of the present invention relates to a resin package and a light-emitting device.

2. Description of Related Art

Light-emitting devices employing light-emitting elements such as LEDs can easily achieve high light emission efficiency, and are therefore used in many devices including backlight devices for display devices and lighting fixtures. Japanese Patent Publication No. 2013-125776 describes a light-emitting device having a resin package including a pair of positive and negative leads and a recess, and a light-emitting element mounted at a bottom surface of the recess of the resin package.

However, in the light-emitting device described in Japanese Unexamined Patent Application Publication No. 2013-125776, gases such as oxygen or sulfur in the atmosphere may enter into the recess and deteriorate surfaces of the pair of leads at the bottom surface of the recess over time. This may hinder efficient reflection of light from the light-emitting element.

One object of certain embodiments of the present invention is to provide a resin package that can efficiently extract light from a light-emitting element to the outside.

SUMMARY

In one embodiment, a resin package includes: a resin portion, a first lead having an upper surface and an end surface, a second lead having an upper surface and disposed opposite the first lead, and a recess having lateral surfaces and a bottom surface that includes a portion of the upper surface of the first lead and a portion of the upper surface of the second lead that are exposed from the resin portion. In a top view, the bottom surface of the recess includes a first side extending along the first lead and the second lead, a second side located opposite to the first side and extending along the first lead and the second lead, a third side that connects the first side and the second side, and a fourth side located opposite to the third side. In a top view, the upper surface of the first lead includes a first groove overlapping the first side, a second groove overlapping the second side, a third groove overlapping the third side, and one or more fourth grooves extending from a portion of the third groove to an end surface of the first lead facing the second lead. The first groove, the second groove, the third groove, and the fourth groove are continuous. A part of the resin portion is disposed on the first groove, the second groove, the third groove, and the fourth groove.

Certain embodiments of the present invention can provide a resin package that can efficiently extract light from a light-emitting element to the outside.

DETAILED DESCRIPTION

Hereinafter, a detailed description of certain embodiments of the invention will be provided with reference to the drawings. A portion or member with the same reference number represents the same or equivalent portion or member shown in a plurality of drawings.

The following description describes embodiments of resin packages and light-emitting devices, to give a concrete form to the technical concepts of the present invention. However, the present invention is not intended to be limited to the embodiments described below. Unless specifically stated otherwise, description of sizes, materials, shapes, and relative positions of constituent components are not intended to limit the scope of the present invention, but rather to provide examples of certain embodiments of the present invention. In the description below, terms representing particular directions or positions (e.g., "upper", "lower", and other terms including these terms) may be used. These terms are used for ease of explanation, representing relative directions and relative positions in the referenced drawings. Sizes or positional relationships of members illustrated in the drawings may be exaggerated so as to facilitate understanding.

Figure 1A:
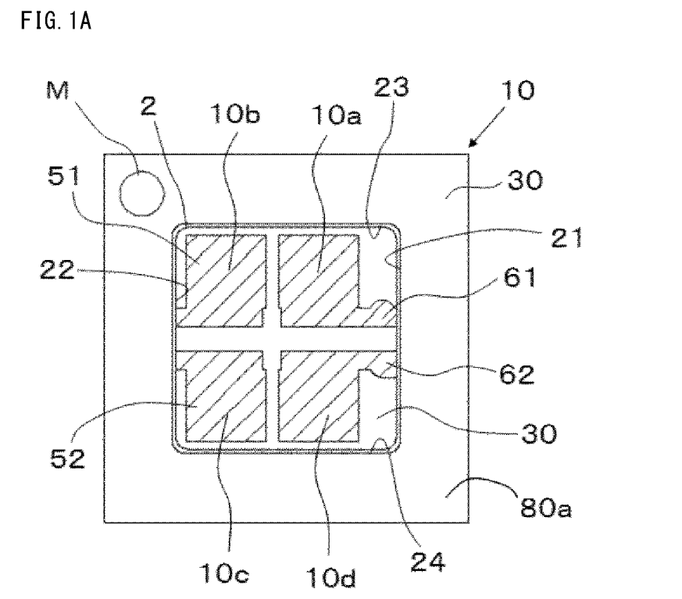
FIG. 1A is a schematic top view of a resin package according to one embodiment.
Figure 1B:
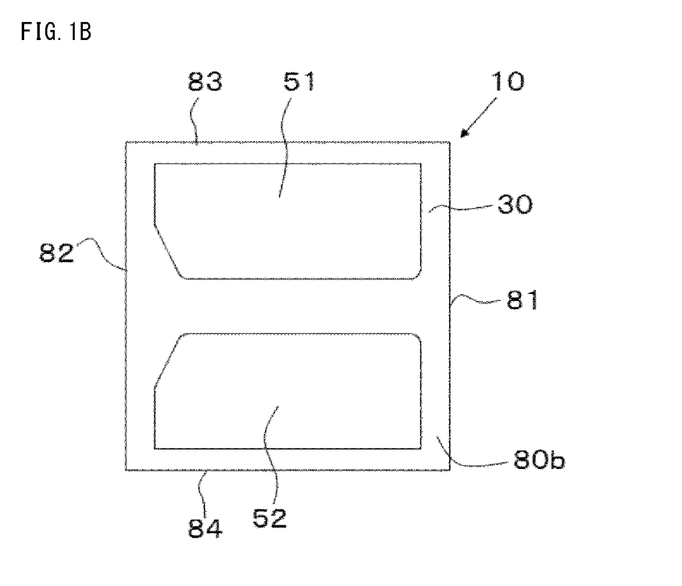
FIG. 1B is a schematic bottom view of the resin package according to one embodiment.
Figure 1C:
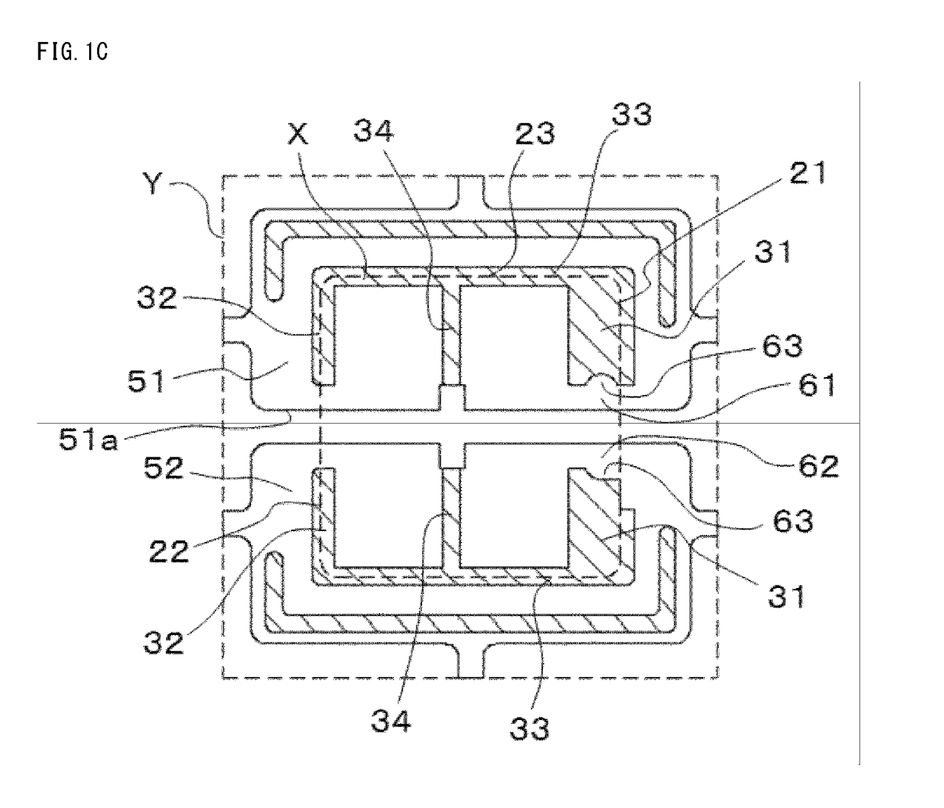
FIG. 1C is a schematic top view of a first lead and a second lead used in the resin package according to one embodiment.

FIG. 1A is a schematic top view of a resin package 10. FIG. 1B is a schematic bottom view of the resin package 10. FIG. 1C is a schematic top view illustrating a first lead 51 and a second lead 52 used in the resin package 10. In FIG. 1A, hatched regions indicate the first lead 51 and the second lead 52 that are exposed at a bottom surface of a recess 2. In FIG. 1C, hatched regions indicate an upper surface of a portion of each of the first lead 51 and the second lead 52 having a smaller thickness (i.e., the portions of a first groove 31, a second groove 32, a third groove 33, a fourth groove 34 and the like, which will be described below).

The resin package 10 is a base on which a light-emitting element described below is to be mounted. The resin package 10 includes a resin portion 30, a first lead 51, and a second lead 52 disposed facing the first lead 51. The resin package 10 defines a recess 2 having an opening in an upper surface 80a of the resin package 10. The bottom surface of the recess 2 has, in a top view, a first side 21, which extends along the first lead 51 and the second lead 52, a second side 22, which is located opposite to the first side 21 and extends along the first lead 51 and the second lead 52, a third side 23 that connects the first side 21 and the second side 22, and a fourth side 24 located opposite to the third side 23.

The resin package 10 shown in FIGS. 1A and 1B has the upper surface 80a, and a lower surface 80b located opposite to the upper surface 80a. The resin package 10 has a substantially rectangular outer shape in a top view. The resin package 10 has a first outer lateral surface 81, a second outer lateral surface 82 located opposite to the first outer lateral surface 81, a third outer lateral surface 83, and a fourth outer lateral surface 84 located opposite to the third outer lateral surface 83.

The lower surface 80b of the resin package 10 serves as a mounting surface to face a mounting board. The first lead 51 and the second lead 52 are exposed from a resin portion 30 at the lower surface 80b of the resin package 10.

A portion of the upper surface of the first lead 51 and a portion of the upper surface of the second lead 52 are exposed from the resin portion 30 on the bottom surface of the recess 2. On the bottom surface of the recess 2 in the resin package 10 shown in FIG. 1A, a region that includes a first element-mounting region 10a, a second element-mounting region 10b, a third element-mounting region 10c, a fourth element-mounting region 10d, a first wire-connecting region 61, and a second wire-connecting region 62 is exposed. The first element-mounting region 10a and the second element-mounting region are located on the upper surface of the first lead 51, and the third element-mounting region 10c and the fourth element-mounting region 10d are located on the upper surface of the second lead 52. Further, on the bottom surface of the recess 2, the first wire-connecting region 61 is located on the first lead 51 along the first side 21, and the second wire-connecting region 62 is located on the second lead 52 along the first side 21. More specifically, the first wire-connecting region 61 is located between the first element-mounting region 10a and the first side 21, and the second wire-connecting region 62 is located between the fourth element-mounting region 10d and the first side 21 in a top view. Each of the element-mounting regions 10a to 10d is a region on which a respective one of the light-emitting elements is to be mounted. A single light-emitting element may be mounted on a corresponding one of the element-mounting regions, or on corresponding two or more of the element-mounting regions. One end portion of each of wires extending from the light-emitting element is to be connected to a corresponding one of the wire-connecting regions.

In FIG. 1A, the resin portion 30 is located on the regions other than the hatched regions on the bottom surface of the recess 2. In other words, on the bottom surface of the recess 2, only a part containing the element-mounting regions and the wire-connecting regions is exposed from the resin portion 30. With this configuration, even if oxygen or sulfur enters inside the recess 2, an area of the first lead 51 or the second lead 52 exposed to oxygen or sulfur can be reduced, so that a possibility of rapid decrease in the light reflectance of the resin package 10 can be reduced. Thus, the resin package 10 allows for light to be efficiently extracted from the light-emitting elements to the outside for a longer period of time. For the resin portion 30, a material less prone to deterioration due to light or heat and having a high light reflectance is preferably used. For example, an epoxy-based or silicone-based resin containing a light-reflective material such as titanium oxide can be used for the resin portion 30.

Next, the first lead 51 and the second lead 52 will be described with reference to FIG. 1C. In FIG. 1C, dashed lines X indicate an outer edge of the bottom surface of the recess 2. The first lead 51 has a first groove 31, a second groove 32, a third groove 33, and a fourth groove 34 at an upper surface of the first lead 51. In a top view, the first groove 31 is at a position that overlaps the first side 21, the second groove 32 is at a position that overlaps the second side, and the third groove 33 is at a position that overlaps the third side 23. In the first lead 51, the first groove 31 extends from one end of the third groove 33 toward an end surface 51a side of the first lead 51 opposite to the second lead 52, and the second groove 32 extends from the other end of the third groove 33 toward the end surface 51a side of the first lead 51.

The first lead 51 further has the fourth groove 34 that extends from a portion of the third groove 33 to the end surface 51a of the first lead 51. In other words, the fourth groove 34 on the first lead 51 has a first end portion connected to the third groove 33 and a second end portion connected to the end surface 51a of the first lead 51. In the resin package 10 shown in FIG. 1C, the fourth groove 34 is located between the first groove 31 and the second groove 32, and extends parallel to the first groove 31 and the second groove 32. The second lead 52 also has the first groove 31, the second groove 32, the third groove 33, and the fourth groove 34, in the same manner as the first lead 51.

In FIG. 1C, dashed lines Y indicate the location of outer lateral surfaces of the resin package 10. The first lead 51 and the second lead 52 are exposed from the resin portion 30 at the outer lateral surfaces, and are substantially in the same plane with the resin portion 30. In this manner, with the first lead 51 and the second lead 52 that do not extend outwardly from the resin portion 30 at the outer lateral surfaces, the resin package 10 having a small occupying area and a small size can be provided.

A plurality of the fourth grooves 34 may be formed in the first lead 51 and/or the second lead 52. The number of the fourth grooves 34 can be selected as appropriate in accordance with, for example, the shape of the electrodes of the light-emitting element and the number of light-emitting elements.

The first groove 31, the second groove 32, the third groove 33, and the fourth groove 34 are, for example, grooves at the upper surface of each of the first lead 51 and the second lead 52, and do not penetrate the first lead 51 and the second lead 52. The depth of each of the first to fourth grooves 31 to 34 is, for example, 0.2 times to 0.8 times the thickness of a corresponding one of the first lead 51 and the second lead 52. For example, when the thickness of the first lead 51 and the second lead 52 is 0.2 mm, the depth of each of the first to fourth grooves 31 to 34 is in a range between 0.04 mm and 0.16 mm. Each of the first to fourth grooves 31 to 34 may have the same or different depth. For example, the first groove 31 of each of the first lead 51 and the second lead 52, which are located near the first wire-connecting region 61 and the second wire-connecting region 62, respectively, has a depth deeper than that of the second grooves 32. Further, for example, in the direction along the end surface 51a of the first lead 51, the first groove 31 has a width wider than a width of the second groove 32. This configuration, for example, allows for improving adhesion among the resin portion 30, the first lead 51, and the second lead 52 near the first grooves 31 and effectively prevent disconnection of wires connected to the wire-connecting regions.

At the upper surface of the first lead 51, the first element-mounting region 10a is defined by the first groove 31, the third groove 33, and the fourth groove 34, and the second element-mounting region 10b is defined by the second groove 32, the third groove 33, and the fourth groove 34. At the upper surface of the second lead 52, the third element-mounting region 10c is defined by the second groove 32, the third groove 33, and the fourth groove 34, and the fourth element-mounting region 10d is defined by the first groove 31, the third groove 33, and the fourth groove 34. The first wire-connecting region 61 at the upper surface of the first lead 51 is located between the first groove 31 and the end surface 51a. The second wire-connecting region 62 at the upper surface of the second lead is located between the second groove 32 and an end surface of the second lead 52 facing the first lead 51. As shown in FIG. 1C, the first groove 31 in the first lead 51 preferably has a recessed portion 63 on a peripheral surface of the first groove 31 facing the end surface 51a in a top view. The recessed portion 63 of the first lead 51 is recessed from the end surface 51a toward the third groove 33 on the peripheral surface of the first groove 31 facing the end surface 51a. With the first groove 31 having the recessed portion 63, the area of the wire-connecting region can be larger than in the case without the recess 63.

The first groove 31, the second groove 32, the third groove 33, and the fourth groove 34 are continuously disposed. This configuration allows a resin material of the resin portion 30 (hereinafter simply referred to as the resin material) to enter into the grooves via respective groove. Then, by solidifying the resin material, the resin portion 30 can be efficiently disposed inside the first groove 31, the second groove 32, the third groove 33, and the fourth groove 34.

One example of entry of the resin material into the first groove 31, the second groove 32, the third groove 33, and the fourth groove 34 will be described below with reference to FIG. 2.

Figure 2:
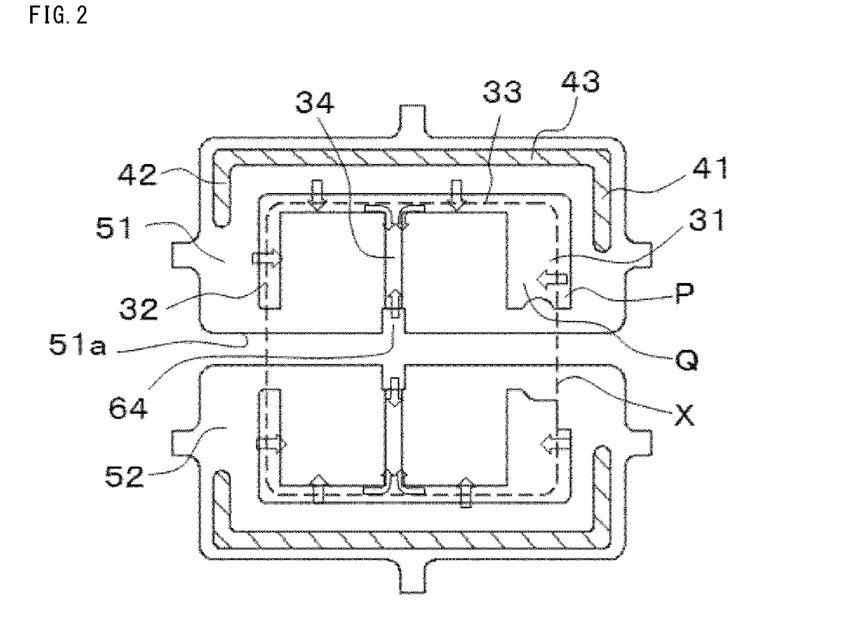
FIG. 2 is a schematic top view for illustrating an example of entry of a resin material into each groove.

As shown in FIG. 2, each of the first groove 31, the second groove 32, and the third groove 33 has, in a top view, an outer portion P, which is located outward of the dashed line X, and an inner portion Q, which is located inward of the dashed lines X, the dashed lines X indicating the outer edge of the bottom surface of the recess 2. The outer portion P is located on the lower part of a side wall of the resin portion 30 constituting lateral surfaces of the recess 2. When the resin material is disposed to form the resin portion 30, the resin material enters into the outer portion P, and also enters into the inner portion Q via the outer portion P. After solidifying, the resin material disposed inside the inner portion Q becomes a portion of the resin portion 30 and constitutes a portion of the bottom surface of the recess 2. That is, a portion of the resin portion 30 in the outer portion P and a portion of the resin portion 30 in the inner portion Q are continuously connected. With the first groove 31, the second groove 32, and the third groove 33 having the outer portion P, which is located outward of the dashed line X, and the inner portion Q, which is located inward of the dashed lines X, the resin portion 30 can be efficiently disposed inside the first groove 31, the second groove 32, and the third groove 33 in the recess 2.

In the first lead 51, the fourth groove 34 has one end portion connected to the third groove 33 and the other end portion connected to the end surface 51a of the first lead 51. That is, on the first lead 51, when the resin material is disposed, the resin material is supplied to the fourth groove 34 from both the third groove 33 and an end portion of the first lead 51 facing the end surface 51a. This allows the resin portion 30 to be efficiently disposed in the fourth groove 34. It is preferable that the first lead 51 further has a through hole 64 in the end surface 51a, which allows the fourth groove 34 to be continuous to the through hole 64. This allows the resin portion 30 to be more efficiently disposed in the fourth groove 34 via the through hole 64. In the direction along the end surface 51a of the first lead 51, as shown in FIG. 1C, the through hole 64 has a wider width than the width of the fourth groove 34. In the fourth groove 34 in the second lead 52, the resin material is supplied in the same manner as in the fourth groove 34 on the first lead 51.

The first lead 51 and/or the second lead 52 preferably has a first outer groove 41 located outside the first groove 31, a second outer groove 42 located outside the second groove 32, a third outer groove 43 located outside the third groove 33. In the first lead 51 and/or the second lead 52 shown in FIG. 1C, in a top view, the first outer groove 41, the second outer groove 42, and the third outer groove 43 are located between outer lateral surfaces of the resin package and the lateral surfaces of the recess 2. With the first lead 51 and/or the second lead 52 having the first outer groove 41, the second outer groove 42, and the third outer groove 43, the adhesion of the resin portion 30 to the first lead 51 or the second lead 52 can be increased.

Figure 3A:
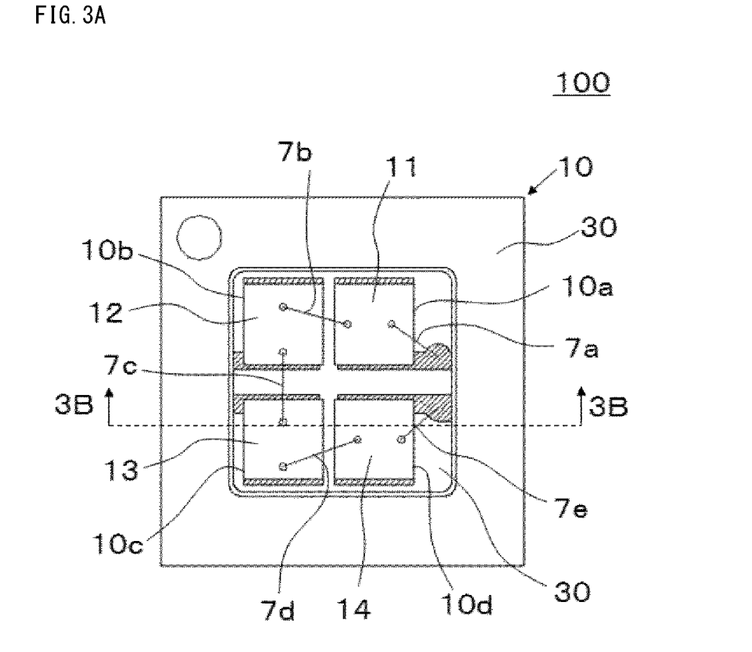
FIG. 3A is a schematic top view of a light-emitting device according to one embodiment.
Figure 3B:
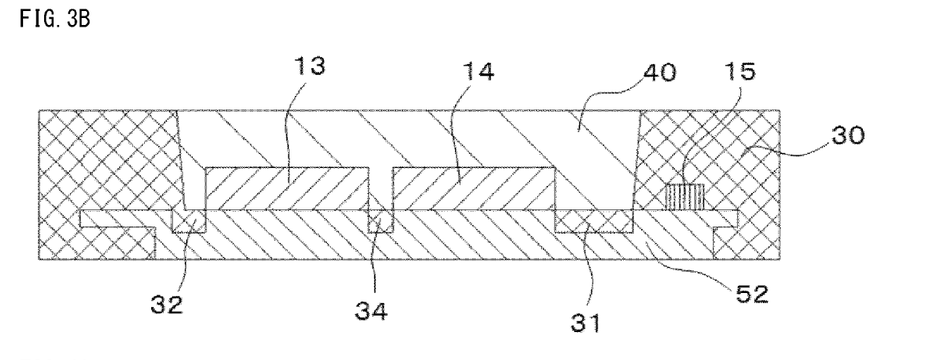
FIG. 3B is a schematic end view taken along the line 3B-3B in FIG. 3A.

FIG. 3A is a schematic top view of a light-emitting device 100. FIG. 3B is a schematic end view taken along the line 3B-3B in FIG. 3A. The light-emitting device 100 includes the resin package 10, a plurality of light-emitting elements including a first light-emitting element 11, a second light-emitting element 12, a third light-emitting element 13, and a fourth light-emitting element 14, and a sealing member 40. Illustration of the sealing member 40 is omitted in FIG. 3A. In FIG. 3A, hatched regions indicate the first lead 51 and the second lead 52 located on the bottom surface of the recess 2. In the light-emitting device 100 shown in FIG. 3A, the first light-emitting element 11 is mounted on the first element-mounting region 10a, the second light-emitting element 12 is mounted on the second element-mounting region 10b, the third light-emitting element 13 is mounted on the third element-mounting region 10c, and the fourth light-emitting element 14 is mounted on the fourth element-mounting region 10d.

The first light-emitting element 11, the second light-emitting element 12, the third light-emitting element 13, and the fourth light-emitting element 14 are connected in series via wires. More specifically, one of electrodes of the first light-emitting element is connected to the first wire-connecting region 61 via a wire 7a, and the other of the electrodes of the first light-emitting element 11 is connected to one of electrodes of the second light-emitting element 12 via a wire 7b. The other of the electrodes of the second light-emitting element 12 is connected to one of electrodes of the third light-emitting element 13 via a wire 7c, and the other of the electrodes of the third light-emitting element 13 is connected to one of electrodes of the fourth light-emitting element 14 via a wire 7d. Then, the other of the electrodes of the fourth light-emitting element 14 is connected to the second wire-connecting region 62 via a wire 7e. In the light-emitting device 100, on the bottom surface of the recess 2, the resin portion 30 covers regions except a region containing the element-mounting regions and the wire-connecting regions. This configuration allows for reducing an area of the region of the first lead 51 or the second lead 52 exposed to oxygen or sulfur even if oxygen or sulfur enters the recess 2, so that rapid decrease in the light reflectance of the resin package 10 can be prevented. Accordingly, the resin package 10 allows light to be efficiently extracted from the light-emitting elements to the outside for a longer period of time.

Each of element-mounting portions preferably has a planer shape that allows a respective one of the light-emitting elements to be self-aligned effectively. For example, at least one of the widths of a planer shape of a mounting surface of each of the light-emitting elements is preferably approximately equal to at least one of the widths of a planer shape of a respective one of the element-mounting portions. When mounting the light-emitting element on the element-mounting portion via a bonding member, this configuration allows the light-emitting element to be self-aligned effectively and to be mounted with increased mounting precision. The term "approximately equal" herein permits the difference in degree of straightness or curve, rounding corners, and permits a variation of the width of the planar shape of the element-mounting potion with respect to the corresponding width of the planar shape of the mounting surface of a respective one of the light-emitting elements of about −10% to +10%.

The light-emitting device 100 preferably includes a protection element 15 to improve electrostatic discharge resistance of the light-emitting device 100. In the light-emitting device 100 shown in FIG. 3B, the protection element 15 is embedded in the resin portion 30. This allows for reducing the absorption of the light from the light-emitting element by the protection element, so that a light-emitting device with high light extract efficiency can be obtained.

Hereinafter, the resin package 10 and members of the light-emitting device 100 according to certain embodiments of the present invention will be described in detail.

Resin Package

The resin package 10 is a base on which a light-emitting element is to be mounted. The resin package 10 includes the resin portion 30, the first lead 51, and the second lead 52. The resin package 10 has the recess 2. The resin package 10 has a quadrangular outer shape in a top view, with dimensions, for example, of 3.0 mm by 1.4 mm, 2.5 mm by 2.5 mm, 3.0 mm by 3.0 mm, or 4.5 mm by 4.5 mm. Examples of the outer shape of the resin package 10 in a top view include, in addition to a quadrangle, other polygonal shapes or an oval shape. The depth of the recess 2 is, for example, 0.5 times to 0.7 times the height of the resin package 10. For example, for the resin package 10 of 0.6 mm in height, the depth of the recess 2 may be 0.4 mm. As shown in FIG. 1A, the resin package 10 can have an anode mark or a cathode mark M indicating the polarity of a corresponding one of the leads, for example, near a corner. The anode mark or the cathode mark M shown in FIG. 1A is a portion of the resin portion 30 on the upper surface 80*a* of the resin package 10, the portion being depressed from the upper surface 80*a* toward the lower surface 80*b*.

The resin package 10 shown in FIG. 1A is such that the first lead 51 and the second lead 52 do not extend outwardly from the resin portion 30 at an outer lateral surface of the resin package 10. However, the present embodiment is not limited thereto. That is, the first lead 51 and the second lead 52 may extend outwardly from the resin portion 30 at an outer lateral surface of the resin package 10. This configuration allows for efficiently dissipating heat from the light-emitting element to the outside.

Resin Portion

A thermosetting resin, a thermoplastic resin, or the like can be used for a resin material to serve as a base material of the resin portion 30. More specifically, examples of the base material include an epoxy resin compound, a silicone resin compound, a modified epoxy resin compound such as a silicone-modified epoxy resin, a modified silicone resin compound such as epoxy-modified silicone resin, a denatured silicone resin compound, an unsaturated polyester resin, a saturated polyester resin, a polyimide resin compound, a modified polyimide resin compound, cured products of the above resin compounds, polyphthalamide (PPA), polycarbonate resin, polyphenylene sulfide (PPS), a liquid crystal polymer (LCP), a resin such as an ABS resin, a phenolic resin, an acrylic resin and a PBT resin. In particular, a thermosetting resin that exhibits good heat and light resistances such as epoxy resin compositions and silicone resin compositions is preferably used for a resin material of the resin portion 30.

The resin portion 30 preferably includes a light-reflective substance in the resin material that serves as a base material. For the light-reflective material, a member that is less likely to absorb light from the light-emitting element and has a large difference in refractive index from the resin material to serve as a base material is preferably used. Examples of the light-reflective material include titanium oxide, zinc oxide, silicon oxide, zirconium oxide, aluminum oxide, and aluminum nitride.

The resin portion 30 may contain a filler that has a low light reflectance with respect to external light (in many cases, sunlight) for the light-emitting device 100 to improve contrast of the light-emitting device 100. In this case, the resin portion 30 is, for example, black or a color close to black. For the filler, carbon black such as acetylene black, activated carbon, or graphite, transition metal oxide such as iron oxide, manganese dioxide, cobalt oxide, or molybdenum oxide, or colored organic pigments can be used in accordance with purpose.

First Lead, Second Lead

The first lead 51 and the second lead 52 are conductive, each of which serves as an electrode for supplying power to corresponding ones of the light-emitting elements. For example, a metal such as copper, aluminum, gold, silver, iron, nickel, an alloy of these metals, phosphor bronze, or copper containing iron, can be used for a base member of each of the first lead 51 and the second lead 52. The first lead 51 and the second lead 52 may have a single-layer structure or a layered structure (e.g., a clad material) of these metals. In particular, copper, which is inexpensive and exhibits good heat dissipation, is preferably used for the base member. Each of the first lead 51 and the second lead 52 may have a metal layer on a surface of the base member. For example, the metal layer contains silver, aluminum, nickel, palladium, rhodium, gold, copper, or an alloy of these metals. The metal layer may be disposed covering an entirety or a portion of each of the first lead 51 and the second lead 52. Also, the metal layer on the upper surface of the lead can be different from the metal layer on the lower surface of the lead. For example, the metal layer on the upper surface of the lead has a layered structure that include a metal layer containing nickel and a metal layer containing silver, while the metal layer on the lower surface of the lead is a metal layer that does not contain nickel. Alternatively, for example, the metal layer made of silver or the like on the upper surface of the lead can be thinner than the metal layer made of silver or the like on the lower surface of the lead.

In the case in which a metal layer containing silver is formed on each of the outermost surface of the first lead 51 and the outermost surface the second lead 52, a protective layer such as silicon oxide is preferably formed on the surface of the metal layer containing silver. This allows for reducing the discoloration of the metal layer containing silver caused by components in the air, such as sulfur. The protective layer can be formed by a deposition method using a vacuum process such as sputtering or may be formed using another known method.

The resin package 10 may include the first lead 51 and the second lead 52. The resin package 10 may also include three or more leads; for example, the resin package 10 can include a third lead in addition to the first lead 51 and the second lead 52. The third lead may serve as a heat dissipating member or serve as an electrode similarly to the first lead 51 and the second lead 52. The first groove 31, the second groove 32, the third groove 33, and the fourth groove 34 is formed at least in the first lead 51. As shown in FIG. 1C, the grooves may also be disposed not only in the first lead 51, but also in the second lead 52, and further in another lead such as the third lead.

Light Emitting Element

The light emitting elements function as a light source of the light-emitting device 100 and also as an excitation light source of a phosphor. A light-emitting diode element or the like, preferably a nitride semiconductor ($In_xAl_yGa_{1-x-y}N$, $0 \leq x$, $0 \leq y$, $x+y \leq 1$) that can emit light in a visible region can be used for the light-emitting elements. The light-emitting device 100 shown in FIG. 3A includes four light-emitting elements. However, the light-emitting device according to the present embodiment is not limited thereto. The light-emitting device 100 includes one or more light-emitting elements. The number of light-emitting elements may be selected according to purpose or use.

Figure 4A:
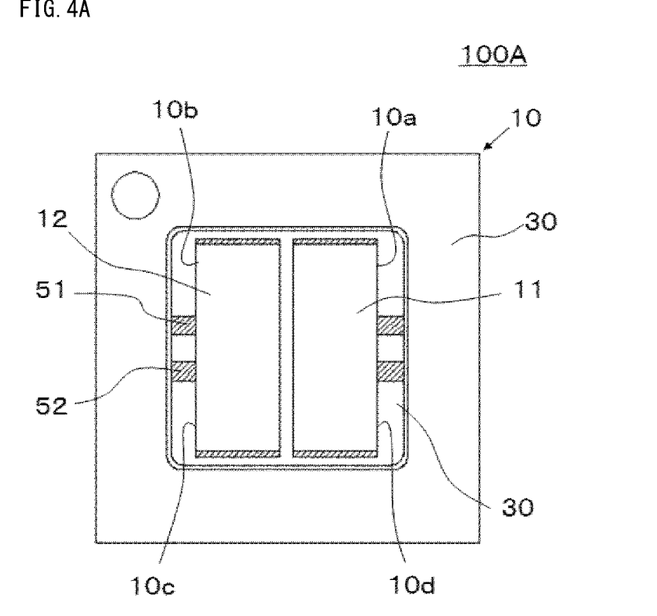
FIG. 4A is a schematic top view of a light-emitting device according to one embodiment.

In the light-emitting device according to the present embodiment, a single light-emitting element may be mounted either on a single element-mounting region, or on a plurality of element-mounting regions. A light-emitting device 100A shown in FIG. 4A includes two light-emitting elements. Each light-emitting element is arranged over a plurality of element-mounting regions. In the light-emitting device 100A, the two light-emitting elements 11 and 12 are flip-chip mounted. More specifically, each of the first and second light-emitting elements 11 and 12 in the light-emitting device 100A has a pair of positive and negative electrodes at a surface of respective light-emitting element. Each of the first and second light-emitting elements 11 and 12 is arranged such that each of positive and negative electrodes face a respective one of the first lead 51 and the second lead 52. Disposing the light-emitting element without using wires eliminates the need for a wire-connecting region on the bottom surface of the recess 2, so that a large-sized light-emitting element can be used.

Figure 4B:
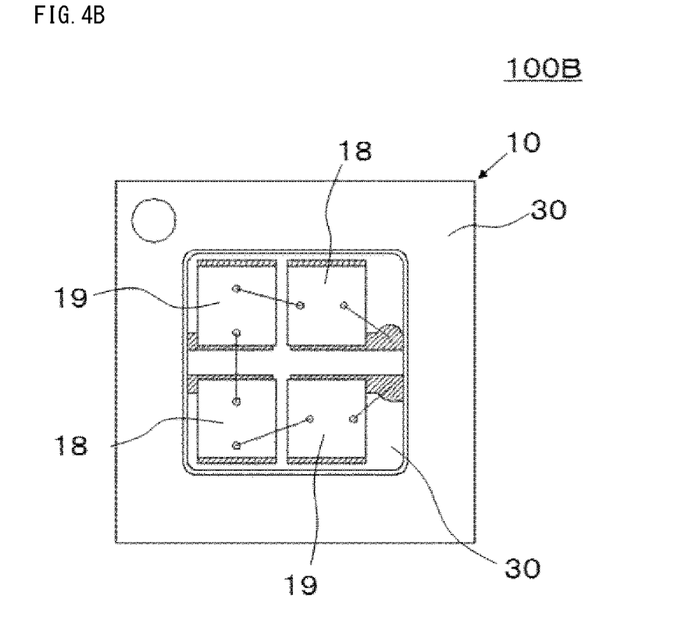
FIG. 4B is a schematic top view of a light-emitting device according to one embodiment.

In the case in which the light-emitting device 100 includes a plurality of light-emitting elements, the plurality of light-emitting elements can include, for example: a plurality of blue-light-emitting elements that emit blue light; three different light-emitting elements that respectively emit blue, green, or red light; or a combination of a light-emitting element that emits blue light and a light-emitting element that emits green light. In the case in which the light-emitting device 100 is used for a light source of a liquid-crystal display, the light-emitting element preferably includes a light-emitting element that emits blue light, or a combination of a light-emitting element that emits blue light and a light-emitting element that emits green light. Both the light-emitting element that emits blue light and the light-emitting element that emits green light preferably have full width at half maximum of 40 nm or less, and more preferably have full width at half maximum of 30 nm or less. This configuration allows the light emitted from the light-emitting elements to have a sharp emission peak in the region of blue light and a sharp emission peak in the region of green light. Accordingly, in the case in which the light-emitting device is used for a light source of a liquid crystal display or the like, the liquid crystal display can achieve high color reproducibility. A light-emitting device 100B shown in FIG. 4B includes two light-emitting elements 18, each of which emits blue light, and two light-emitting elements 19, each of which emits green light. In the light-emitting device 100B, the two light-emitting elements 18 are arranged at diagonal positions, and the two light-emitting elements 19 are arranged at diagonal positions. With this arrangement, a light-emitting device with good color mixing properties can be obtained.

The light-emitting device 100 shown in FIG. 3A includes light-emitting elements all of which are connected in series. However, the light-emitting device according to the present embodiment is not limited thereto. The light-emitting elements may be connected in series, in parallel, or in a combination of series and parallel.

Sealing Member

The light-emitting device 100 includes a sealing member 40 that covers the light-emitting element. The sealing member 40 protects the light-emitting element and the like from, for example, external forces, dust, and moisture. The sealing member 40 preferably transmits 60% or more of light emitted from the light-emitting element, and more preferably, 90% or more. A resin material used for the resin portion 30 can be used for a base material of the sealing member 40. For a resin material to serve as the base material, a thermosetting resin, a thermoplastic resin, or the like can be used. For example, a silicone resin, an epoxy resin, an acrylic resin, or a resin containing one or more of these resins can be used. The sealing member can be formed of a single layer or can include a plurality of layers. The sealing member 40 can include light scattering particles such as titanium oxide, silicon oxide, zirconium oxide, and aluminum oxide, the light scattering particles being dispersed in the sealing member.

The sealing member 40 can contain one or more phosphors adapted to convert the wavelength of light emitted from the light-emitting element. A phosphor excited by the light from the light-emitting element may be used for the phosphor. Examples of the phosphor can include $(Ca,Sr,Ba)_5(PO_4)_3(Cl,Br):Eu$, $(Sr,Ca,Ba)_4Al_{14}O_{25}:Eu$, $(Ca,Sr,Ba)_8MgSi_4O_{16}(F,Cl,Br)_2:Eu$, $(Y,Lu,Gd)_3(Al,Ga)_5O_{12}:Ce$, $(Sr,Ca)AlSiN_3:Eu$, $3.5MgO \cdot 0.5MgF_2 \cdot GeO_2:Mn$, $(x-s)MgO \cdot (s/2)Sc_2O_3 \cdot yMgF_2 \cdot uCaFa \cdot (1-t)GeO_2 \cdot (t/2)M'_2O_3:zMn$, $Ca_3Sc_2Si_3O_{12}:Ce$, $CaSc_2O_4:Ce$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ca,Sr,Ba)_2Si_5N_8:Eu$, $(Ca,Sr,Ba)S:Eu$, $(Ba,Sr,Ca)Ga_2S_4:Eu$, $K_2(Si,Ti,Ge)F_6:Mn$, and $Si_{6-z}Al_zO_zN_{8-z}:Eu$ ($0<z<4.2$).

In particular, a combination of $Si_{6-z}Al_zO_zN_{8-z}:Eu$ ($0<z<4.2$) and $K_2(Si,Ti,Ge)F_6:Mn$, is preferably used for the phosphor. A combination of these two phosphors with the blue-light-emitting element can provide a light-emitting device with good color reproducibility. It is preferable that $(Sr,Ca)AlSiN_3:Eu$ is further combined with the combination of the two types of phosphors, that is, $Si_{6-z}Al_zO_zN_{8-z}:Eu$ ($0<z<4.2$) and $K_2(Si, Ti, Ge) F_6:Mn$, $(Sr,Ca)AlSiN_3:Eu$. Combination with $(Sr,Ca)AlSiN_3:Eu$ allows for reducing, for example, afterglow of the light-emitting device.

The light scattering particle and/or the phosphor may be preferably contained at a content of, for example, about 10 mass % to 150 mass % with respect to the total weight of the sealing member 40.

What is claimed is:

1. A light-emitting device comprising:
   a resin package comprising:
   a resin portion,
   a first lead having an upper surface and an end surface,
   a second lead having an upper surface and disposed opposite the first lead, and a recess having lateral surfaces and a bottom surface that includes a portion of the upper surface of the first lead and a portion of the upper surface of the second lead that are exposed from the resin portion; and a first light-emitting element and a second light-emitting element that are disposed in the recess;

wherein, in a top view, the bottom surface of the recess includes:
a first side extending along the first lead and the second lead,
a second side located opposite to the first side,
a third side that connects the first side and the second side, and
a fourth side located opposite to the third side;

wherein, in a top view, the upper surface of the first lead includes:
a first groove overlapping the first side,
a second groove overlapping the second side,
a third groove overlapping the third side, and
one or more fourth grooves extending from a portion of the third groove to an end surface of the first lead facing the second lead;

wherein the first groove, the second groove, the third groove, and the fourth groove are continuous;

wherein a part of the resin portion is disposed on the first groove, the second groove, the third groove, and the fourth groove;

wherein the first light-emitting element is mounted on a first element-mounting region defined by the first groove, the third groove, and the one or more fourth grooves on the upper surface of the first lead; and wherein the second light-emitting element is mounted on a second element-mounting region defined by the second groove, the third groove, and the one or more fourth grooves on the upper surface of the first lead.

2. The light-emitting device according to claim 1, wherein a trough hole is formed in the end surface of the first lead; and
wherein the one or more fourth grooves are continuous with the through hole.

3. The light-emitting device according to claim 1,
wherein the first lead has a first wire-connecting region between the first groove and the end surface of the first lead; and
wherein, in a top view, a width of the first groove is greater than a width of the second groove in a direction along the end surface of the first lead.

4. The light-emitting device according to claim 1, wherein the one or more fourth grooves comprise a plurality of fourth grooves.

5. The light-emitting device according to claim 1,
wherein the first lead further includes, in a top view:
a first outer groove located outside the first groove,
a second outer groove located outside the second groove, and
a third outer groove located outside the third groove, and
wherein the first outer groove, the second outer groove, and the third outer groove are located between outer lateral surfaces of the resin package and the lateral surfaces of the recess.

6. The light-emitting device according to claim 1,
wherein the first groove includes, in a top view, a depressed portion on a peripheral surface of the first groove, the recess being recessed from the peripheral surface toward the third groove.

7. The light-emitting device according to claim 1,
wherein, in a top view, an outer edge of the first groove and an outer edge of the fourth groove located opposite to the first groove extends parallel to one another.

8. The light-emitting device according to claim 1,
wherein, in a top view, an outer edge of the second groove and an outer edge of the fourth groove located opposite to the second groove extends parallel to one another.

9. The light-emitting device according to claim 1, comprising a protection element;
wherein the protection element is embedded in the resin portion.

10. The light-emitting device according to claim 1,
wherein the first light-emitting element has full width at half maximum of 40 nm or less.

11. The light-emitting device according to claim 1,
wherein a trough hole is formed in the end surface of the first lead;
wherein the one or more fourth grooves are continuous with the through hole;
wherein the first lead has a first wire-connecting region between the first groove and the end surface of the first lead; and
wherein, in a top view, a width of the first groove is greater than a width of the second groove in a direction along the end surface of the first lead.

12. The light-emitting device according to claim 1,
wherein a trough hole is formed in the end surface of the first lead;
wherein the one or more fourth grooves are continuous with the through hole; and
wherein the one or more fourth grooves comprise a plurality of fourth grooves.

13. The light-emitting device according to claim 1,
wherein a trough hole is formed in the end surface of the first lead;
wherein the one or more fourth grooves are continuous with the through hole;
wherein the first lead further includes, in a top view:
a first outer groove located outside the first groove,
a second outer groove located outside the second groove, and
a third outer groove located outside the third groove;
wherein the first outer groove, the second outer groove, and the third outer groove are located between outer lateral surfaces of the resin package and the lateral surfaces of the recess.

14. The light-emitting device according to claim 1,
wherein a trough hole is formed in the end surface of the first lead;
wherein the one or more fourth grooves are continuous with the through hole; and
wherein the first groove includes, in a top view, a depressed portion on a peripheral surface of the first groove, the recess being recessed from the peripheral surface toward the third groove.

15. The light-emitting device according to claim 1,
wherein a trough hole is formed in the end surface of the first lead;
wherein the one or more fourth grooves are continuous with the through hole; and
wherein, in a top view, an outer edge of the first groove and an outer edge of the fourth groove located opposite to the first groove extends parallel to one another.

16. The light-emitting device according to claim 1,
wherein a trough hole is formed in the end surface of the first lead;

wherein the one or more fourth grooves are continuous with the through hole; and wherein, in a top view, an outer edge of the second groove and an outer edge of the fourth groove located opposite to the second groove extends parallel to one another.

17. The light-emitting device according to claim 1, comprising a protection element;
wherein a trough hole is formed in the end surface of the first lead;
wherein the one or more fourth grooves are continuous with the through hole; and
wherein the protection element is embedded in the resin portion.

18. The light-emitting device according to claim 1,
wherein a trough hole is formed in the end surface of the first lead;
wherein the one or more fourth grooves are continuous with the through hole; and
wherein the first light-emitting element has full width at half maximum of 40 nm or less.

19. The light-emitting device according to claim 1,
wherein a trough hole is formed in the end surface of the first lead;
wherein the one or more fourth grooves are continuous with the through hole;
wherein, in a top view, an outer edge of the first groove and an outer edge of the fourth groove located opposite to the first groove extends parallel to one another; and
wherein, in a top view, an outer edge of the second groove and an outer edge of the fourth groove located opposite to the second groove extends parallel to one another.

20. The light-emitting device according to claim 1, comprising a protection element;
wherein a trough hole is formed in the end surface of the first lead;
wherein the one or more fourth grooves are continuous with the through hole;
wherein, in a top view, an outer edge of the first groove and an outer edge of the fourth groove located opposite to the first groove extends parallel to one another;
wherein, in a top view, an outer edge of the second groove and an outer edge of the fourth groove located opposite to the second groove extends parallel to one another; and
wherein the protection element is embedded in the resin portion.

* * * * *

UNITED STATES PATENT AND TRADEMARK OFFICE
CERTIFICATE OF CORRECTION

PATENT NO. : 10,944,035 B2  
APPLICATION NO. : 16/773434  
DATED : March 9, 2021  
INVENTOR(S) : Yuta Horikawa et al.

Page 1 of 2

It is certified that error appears in the above-identified patent and that said Letters Patent is hereby corrected as shown below:

In the Drawings

Please replace Fig. 1C with Fig. 1C as shown on the attached page.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*

FIG. 1C